(12) United States Patent
Moinpour et al.

(10) Patent No.: US 6,357,071 B2
(45) Date of Patent: *Mar. 19, 2002

(54) ROTATING BELT WAFER EDGE CLEANING APPARATUS

(75) Inventors: Monsour Moinpour, Cupertino; Ilan Berman, Sunnyvale; Young C. Park, Mountain View, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/128,343

(22) Filed: Aug. 3, 1998

Related U.S. Application Data

(62) Division of application No. 08/777,518, filed on Dec. 30, 1996, now Pat. No. 5,868,857.

(51) Int. Cl.$^7$ ................ B08B 7/00; A47L 1/02
(52) U.S. Cl. ................ 15/102; 15/77; 15/97.1; 15/88.2; 134/902; 451/44; 451/310
(58) Field of Search .............. 15/97.1, 102, 3, 15/77, 88.2; 451/310, 307, 43, 44, 66; 134/6, 902

(56) References Cited

U.S. PATENT DOCUMENTS

| | | | |
|---|---|---|---|
| 329,863 A | 11/1885 | Straker | 15/102 |
| 1,798,421 A | * 3/1931 | Hitchcock | 451/307 |
| 2,929,088 A | 3/1960 | Wier, Jr. | 15/102 |
| 3,488,891 A | * 1/1970 | Kissling | 451/310 |
| 3,995,343 A | 12/1976 | Horner | 15/102 |
| 4,027,686 A | 6/1977 | Shortes et al. | 134/33 |
| 4,202,071 A | 5/1980 | Scharpf | 15/302 |
| 4,292,767 A | 10/1981 | Fatula | 51/145 R |
| 4,326,553 A | 4/1982 | Hall | 134/153 |
| 4,488,382 A | 12/1984 | Zajac et al. | 51/165.92 |
| 4,656,790 A | 4/1987 | Mukai et al. | 51/141 |
| 4,699,118 A | * 10/1987 | Tsuruta et al. | 451/310 |
| 4,833,834 A | * 5/1989 | Patterson | 451/310 |
| 5,012,618 A | 5/1991 | Price et al. | 51/140 |
| 5,013,367 A | 5/1991 | Butts | 134/9 |
| 5,128,281 A | 7/1992 | Dyer et al. | 437/225 |
| 5,142,725 A | 9/1992 | Hayes et al. | 15/77 |
| 5,144,711 A | 9/1992 | Gill, Jr. | 15/97.1 |
| 5,148,569 A | 9/1992 | Jailor et al. | 15/41.1 |
| 5,185,961 A | * 2/1993 | Maier | 451/307 |
| 5,241,792 A | 9/1993 | Naka et al. | 51/165.9 |
| 5,350,428 A | 9/1994 | Leroux et al. | 29/25.01 |
| 5,351,360 A | 10/1994 | Suzuki et al. | 15/302 |
| 5,485,644 A | 1/1996 | Shinbara et al. | 15/21.1 |
| 5,595,522 A | 1/1997 | Simpson et al. | 451/5 |
| 5,643,044 A | 7/1997 | Lund | 451/5 |
| 5,651,160 A | 7/1997 | Yonemizu et al. | 15/302 |
| 5,733,181 A | 3/1998 | Hasegawa et al. | 451/168 |
| 5,868,857 A | * 2/1999 | Moinpour et al. | 15/97.1 |

FOREIGN PATENT DOCUMENTS

| | | | |
|---|---|---|---|
| DE | 2055153 | 5/1972 | 15/77 |
| FR | 2488157 | 2/1982 | 15/88.3 |
| JP | 60-143634 | 7/1985 | 15/77 |
| WO | WO 92/03313 | 3/1992 | 15/21.1 |

* cited by examiner

Primary Examiner—Gary K. Graham
(74) Attorney, Agent, or Firm—Blakely, Sokoloff, Taylor & Zafman LLP

(57) ABSTRACT

An apparatus for cleaning edges and/or bevel areas of substrates. In one embodiment, the present invention provides a cleaning mechanism that cleans particles off the edge of the wafer based upon friction at the contact point between the wafer and a rotating belt.

21 Claims, 7 Drawing Sheets

ROTATING BELT WAFER EDGE CLEANING APPARATUS

This is a divisional of application Ser. No. 08/777,518, filed Dec. 30, 1996, now U.S. Pat. No. 5,868,857 issued Feb. 9,1999.

FIELD OF THE INVENTION

The present invention relates to the field of semiconductor wafer processing; more particularly, the present invention relates to cleaning the edges and/or bevel areas of semiconductor wafers.

BACKGROUND OF THE INVENTION

Semiconductor manufacturers use semiconductor wafers as the base for manufacturing integrated circuits. In one step of the manufacturing process, the wafers are put through chemical mechanical polishing (CMP). CMP is becoming the main planarization technology for both dielectric and metal layers. For the CMP of dielectric layers, such as BPSG, BPTEOS, and PECVD Oxides (often referred to as the ILD0, ILD1, ILD2 . . . layers, respectively), a fumed silica-based slurry is normally used. Other slurries, such as dispersed silica, fumed or dispersed allumina, are also being used for CMP of both oxides and metals (such as tungsten (W), copper (Cu), aluminum (al), and titanium (Ti)). When the CMP process is completed, the wafers' surfaces are covered in particles, referred to as a slurry residue. At later steps in the process flow, some of this slurry residue is redistributed across the front of the wafer, thereby resulting in a loss in die yield and/or device performance. To prevent the slurry redistribution, all surfaces of a wafer must be free of contamination.

Different post CMP cleaning methods have been introduced in the last few years. These include cleaning the wafers in wet stations using conventional wet cleaning methods, such as SC1, HF and megasonic cleaning. Other cleaning methods in use are based on scrubbing wafers with brushes of various kinds and configurations using DI water or a combination of DI with chemicals such as Ammonia and Citric acid.

One system used to remove wafer contaminants is a double sided scrubber. In a double sided scrubber, a semiconductor wafer is scrubbed simultaneously on both sides by brushes. Since the wafer is being scrubbed simultaneously on both sides by the brushes, there must be a way of holding the wafer in place and rotating the wafer so the entire surface of the wafer is cleaned. A mechanism used for this purpose is commonly referred to as a roller.

Today, double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. FIG. 1 illustrates a conventional double sided wafer scrubber. Referring to FIG. 1, a wafer 102 is being scrubbed by brushes, one of which is shown as brush 110 and the other being beneath wafer 102 and directly below brush 110. Rollers 108 rotate wafer 102 so the entire wafer surface may be cleaned. Each of brushes 110 is rotated about its central axis by a motor 106. The rotary motion of rollers 108, 109 is then transferred to wafer 102 when the edge of each of rollers 108, 109 comes into contact with the outer edge of wafer 102.

Although conventional brush cleaning systems can effectively clean the front and backs of semiconductor substrates, such systems fail to provide a sufficient amount of mechanical energy at the edge/bevel to remove contamination.

The present invention provides an apparatus that cleans the edge of substrates, including the bevel area when present.

SUMMARY OF THE INVENTION

An apparatus for cleaning edges and/or bevel areas of substrates is described. In one embodiment, the present invention provides a cleaning mechanism that cleans particles off the edge of the wafer based upon friction at the contact point between the wafer and a rotating belt.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

An apparatus for cleaning edges of contaminated substrates is described. The cleaning process may be used in double sided scrubber systems or other systems, such as, for instance, chemical mechanical polishing systems or flat panel display manufacturing systems. In the following description, numerous specific details are set forth such as rotation speeds, chemicals, pressures, etc., in order to provide a thorough understanding of the present invention. It will be apparent, however, to one skilled in the art that the present invention may be practiced without these specific details. In other instances, well-known components, structures and techniques have not been shown in detail in order to avoid obscuring the present invention.

The present invention provides a method and apparatus that cleans the edge of substrates, including the bevel area when present. In the present invention, particles are removed from the edge and/or bevel area (or any other surface sloping from the edge to the top or bottom of the substrate) using an edge scrubbing mechanism that may be incorporated into a scrubber tool.

Although the present invention is described in conjunction with the scrubbing of a wafer, it will be appreciated that any similarly shaped, i.e. generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, two or multiple substrates bonded to each other, or substrates for processing other apparatuses and devices such as flat panel displays, multichip modules, etc.

Figure 1:
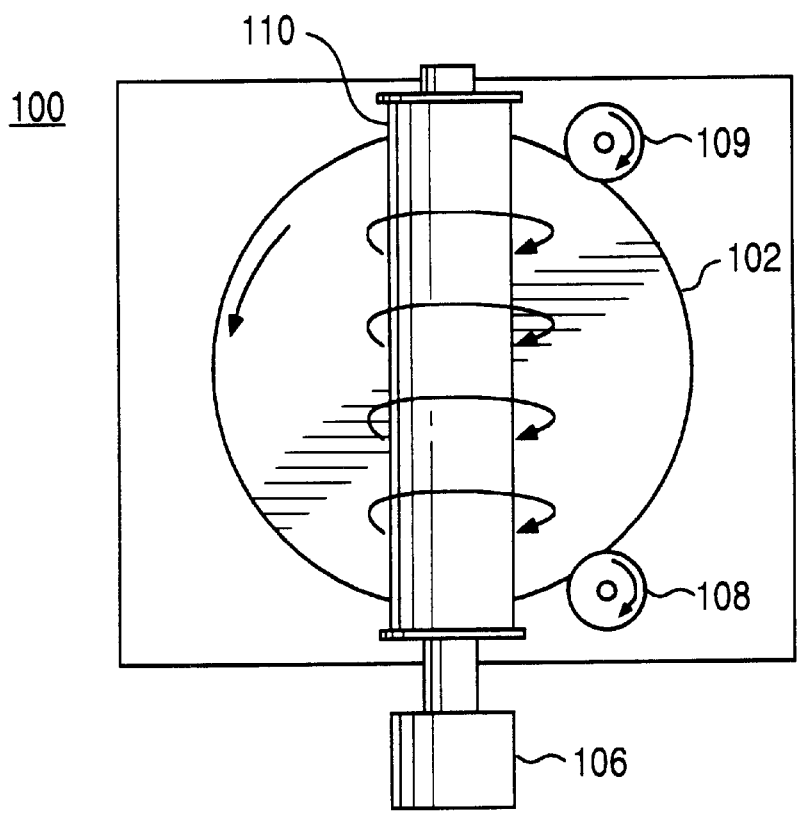
FIG. 1 illustrates a prior art double sided wafer scrubber.
Figure 2A:
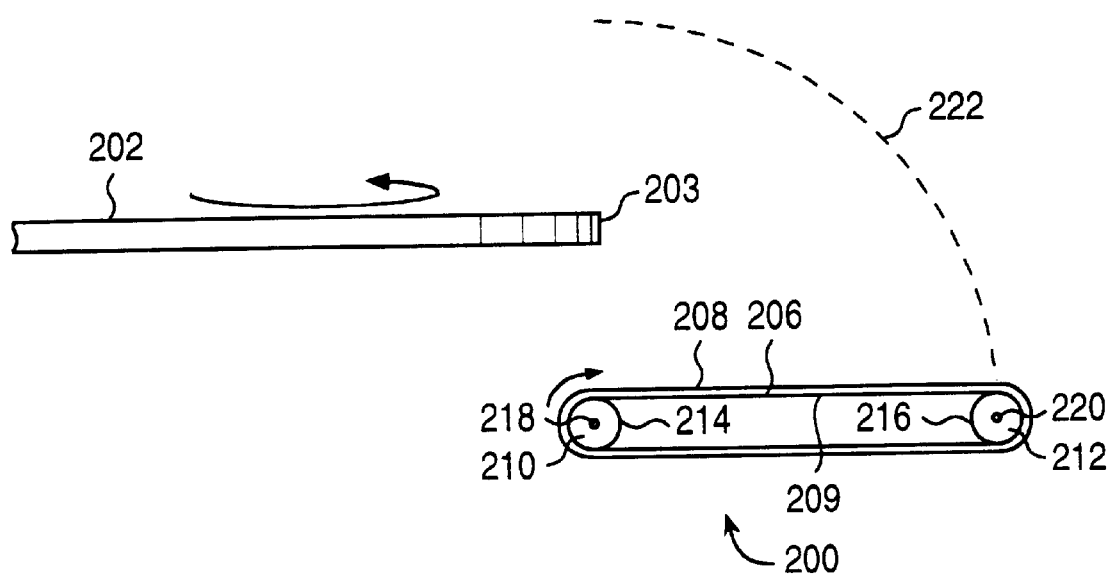
FIG. 2A illustrates a side view of a rotating belt edge cleaning apparatus in one embodiment of the present invention with the rotating belt rotated away from the edge of a wafer.
Figure 2B:
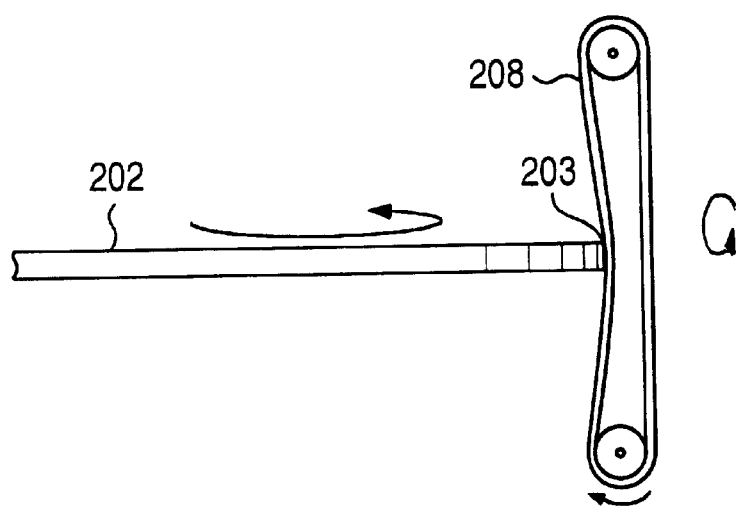
FIG. 2B illustrates a side view of the rotating belt edge cleaning apparatus of FIG. 2A with the rotating belt engaged against the edge of the wafer.

FIGS. 2A and 2B illustrate a wafer edge cleaning device in one embodiment of the present invention. As shown, the edge 203 of a rotating wafer 202 is cleaned by positioning a rotating belt 206 adjacent to the wafer edge 203 such that an abrasive outer surface 208 of the belt slides across the edge surface. The frictional forces generated between the outer surface 208 of belt 206 and edge 203 result in the removal of contaminates residing at the contact points at the belt/edge interface. The relative velocity difference between belt 206 and wafer 202 also contributes to the removal of particles from the edge surface. The inner surface 209 of belt 206 is acted upon by the outer surfaces 214 and 216 of rollers 210 and 212, respectively. Each of rollers 210 and 212 have an axis of rotation 218 and 220, respectively. The location of axis 218 is fixed, whereas axis 220 is permitted to move along a path 222 as roller 212 is pivoted in an upward direction about fixed axis 218. A motor (not shown) is coupled to roller 210 to provide rotational movement to the roller. The resistance between the outer surface 214 of roller 210 and inner surface 209 of belt imparts the rotational movement of roller 210 to belt 206.

In one embodiment axes 218 and 220 are perpendicular to the rotational axis of the wafer 202. In yet another embodiment, axes 218 and 220 are oblique to the rotational axis of wafer 202.

As shown in FIG. 2A and 2B, the edge 203 of wafer 202 is cleaned by placing the wafer adjacent edge cleaning apparatus 200 and pivoting roller 220 in an upward direction about axis 218 so that the outer surface 208 of belt 206 contacts the edge 203 of wafer 202. In one embodiment, belt 206 comprises an elastomer material that is stretched to fit over rollers 210 and 212. Alternatively, roller 212 may be slidably mounted. In such an embodiment, belt 206 is placed around the outer surfaces of the rollers and the tension of belt 206 is adjusted by slidably adjusting the position of roller 212. The outer surface 208 of belt 206 is textured such that sufficient frictional forces are produced at the belt/wafer edge interface to remove contaminates from the wafer edge during cleaning. The surface roughness of surface 208 is selected to facilitate the removal of unwanted particles from the wafer's edge without damaging the wafer itself. In some instances, the texture of belt 206 may vary along the circumference of the belt. In this manner, one portion of the belt may be used for removing one type of contaminate while another portion of the belt may be used to remove another type of contaminate.

Figure 3A:
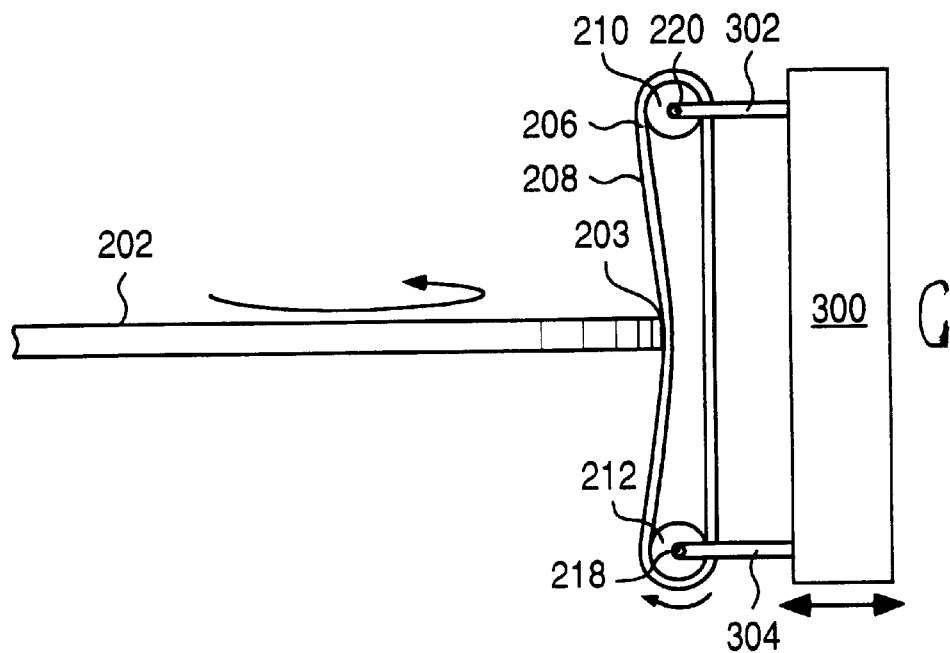
FIG. 3A illustrates a rotating belt edge cleaning apparatus attached to a carrier that moves to engage or disengage the rotating belt from the edge of a wafer.
Figure 3B:
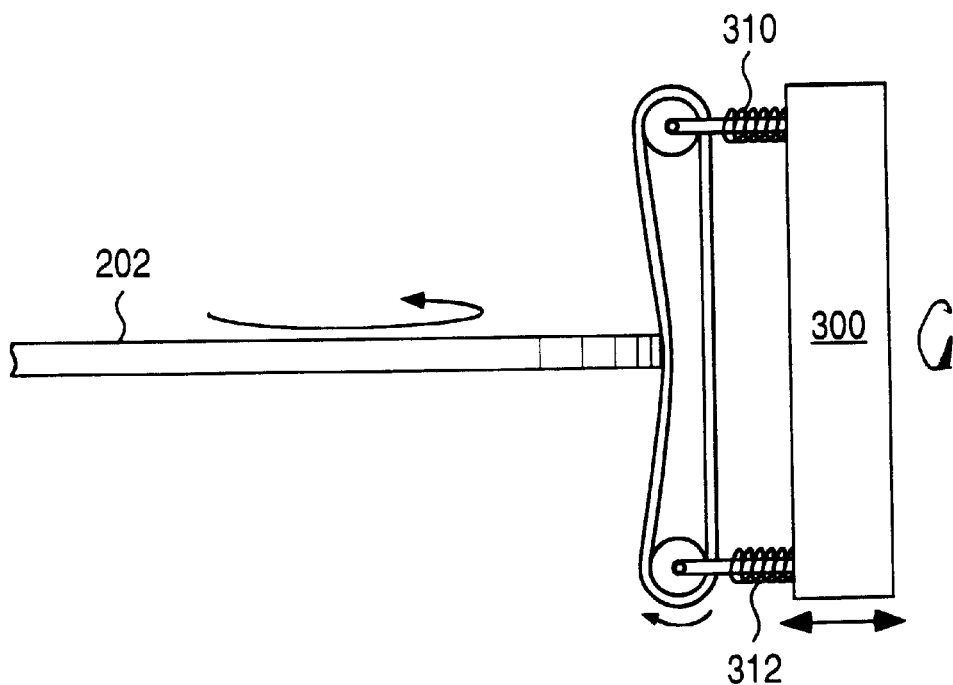
FIG. 3B illustrates another embodiment of the present invention.

FIG. 3A illustrates another method of cleaning the edge of a wafer. As shown in FIG. 3A, rollers 210 and 212 are attached to support structure 300 at axis 218 and 220. In lieu of using a pivoting action to bring the belt 206 into contact with wafer edge 203, the lateral movement of support structure 300 is used to position the edge cleaning apparatus. In addition, rollers 210 and 212 may be spring mounted to structure 300 by springs 310 and 312. By spring mounting rollers 210 and 212 to structure 300, the amount of force exerted upon edge 203 by belt 206 is more accurately controlled.

In one embodiment, the width of belt 206 is approximately 0.5 inches. The outer surface 208 of belt 206 may comprise PVA, nylon, or polyurethane.

Figure 4A:
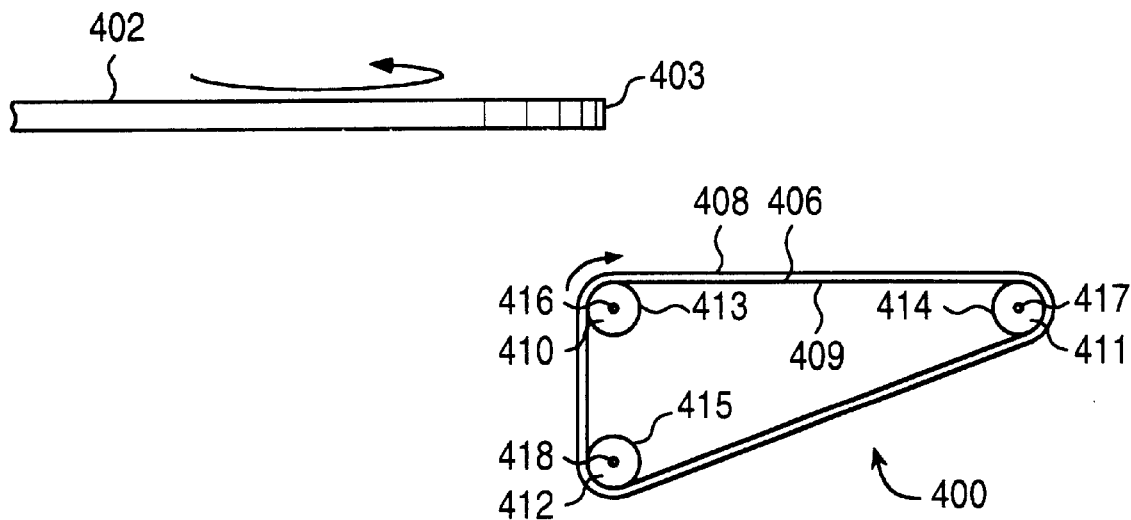
FIG. 4A illustrates a side view of a rotating belt edge cleaning apparatus in another embodiment of the present invention with the rotating belt rotated away from the edge of a wafer.
Figure 4B:
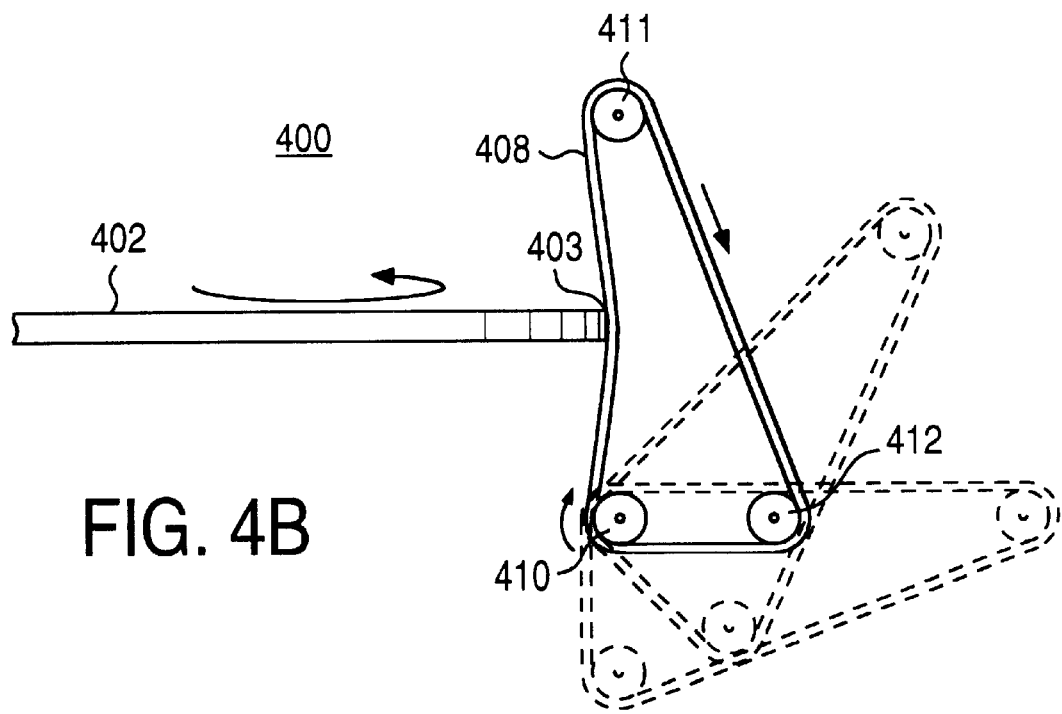
FIG. 4B illustrates a side view of the rotating belt edge cleaning mechanism of FIG. 4A showing the rotational movement of the mechanism as it engages the edge of the wafer.

With reference to FIGS. 4A and 4B, a belt-type edge cleaning apparatus 400 in another embodiment of the present invention is shown. The belt-type edge cleaning apparatus 400 is similar to the edge cleaning apparatus 200 of FIGS. 2A and 2B, however, apparatus 400 includes three rollers instead of two. Edge cleaning apparatus 400 includes a belt 406 having an inner surface 409 and an outer surface 408. Belt 406 is held in position and rotated by three rollers 410–412. Each of rollers 410–412 has an axis of rotation 416, 417 and 418 respectively. Additionally, wafer 402 is rotated about an axis of rotation. Axis 416 is stationary, whereas axes 417 and 418 are permitted to move generally in the direction indicated in FIG. 4B as the belt assembly is pivoted upward about axis 416. A motor (not shown) is coupled to roller 410 to provide rotational movement to belt 406. As shown in FIG. 4B, the edge 403 of wafer 402 is cleaned by placing the edge of wafer 402 in proximity to rotating belt edge cleaning apparatus 400 and pivoting apparatus 400 upward about stationary axis 416 to engage the outer surface 408 of belt 406 against wafer edge 403.

In one embodiment, axes 416, 417 and 418 are oblique to the rotational axis of the wafer 402.

Figure 5A:
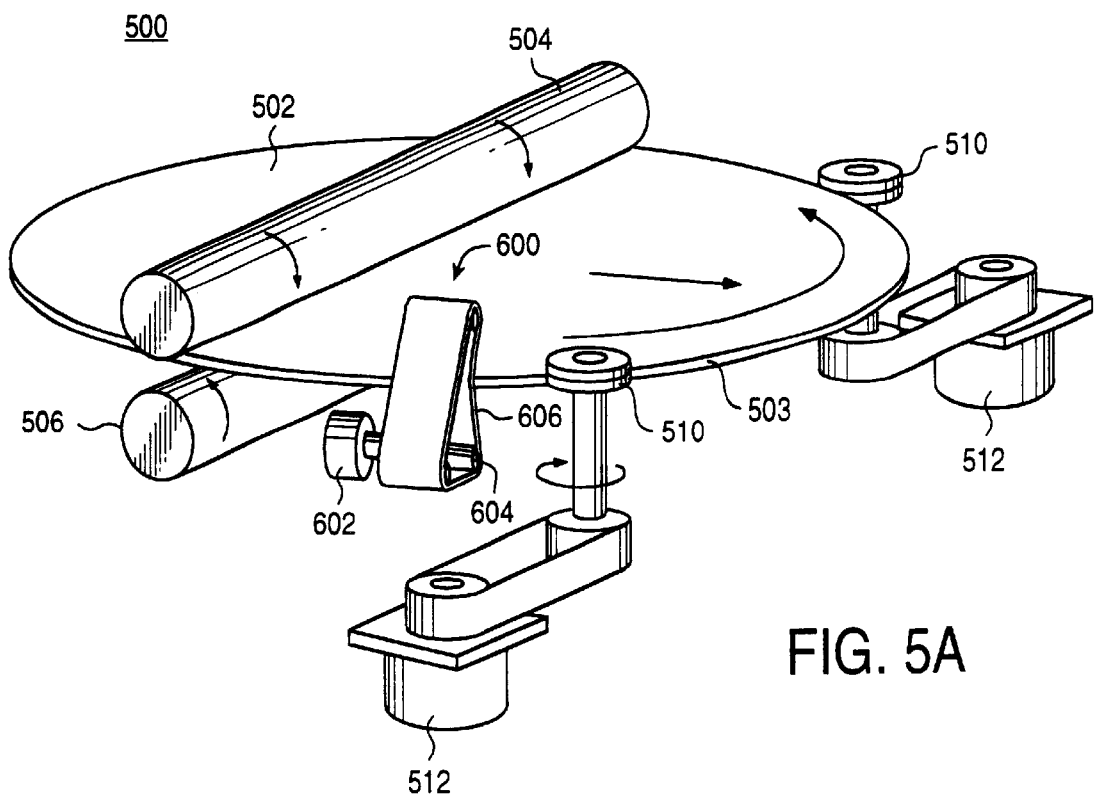
FIG. 5A illustrates a perspective view of a double-sided edge scrubber system that includes a rotating belt edge cleaning apparatus.

Turning now to FIG. 5A, edge cleaning apparatus 600 is shown incorporated into a double sided scrubber 500. As illustrated in FIG. 5A, wafer 502 is cleaned by a top-side brush 504 and a bottom-side brush 506 as it moves through the scrubber (from left to right). Edge rollers 510 are provided to rotate wafer 502 in a counter-clockwise direction as indicated. Motors 512 are coupled to edge rollers 510 to provide rotational movement to the wafer. A rotating belt edge cleaning apparatus 600 is provided along side wafer 502. As wafer 502 moves through scrubber 500, edge cleaning apparatus 600 is rotated upward such that belt 606 is pressed against wafer edge 503. Hence, as wafer 502 moves through the double sided scrubber system, top-side and bottom-side brushes 504 and 506 clean the top and bottom surfaces of wafer 502, while rotating belt 606 removes contaminates along the edge and bevel areas of the wafer. A motor 602 is coupled to stationary roller 604 to provide rotational movement to the edge cleaning belt 606.

One benefit of the present invention lies in the combined use of top-side and bottom-side brushes 504 and 506 and edge cleaning apparatus 600 to clean all of the exposed areas of the wafer which may be contaminated with slurry particles. This includes the top surface, bottom surface and the edge/bevel areas of the wafer. Another benefit of the present invention is that the rotating edge cleaning apparatus 600 may be integrated into current double-side scrubber mechanism with minimal design changes to the scrubber system. In addition, since the rotation of the edge cleaning apparatus is independent of the wafer rotation, the relative velocity of the edge cleaning apparatus may be varied without affecting the cleaning of the top-side and bottom-side surfaces of the wafer.

Figure 5B:
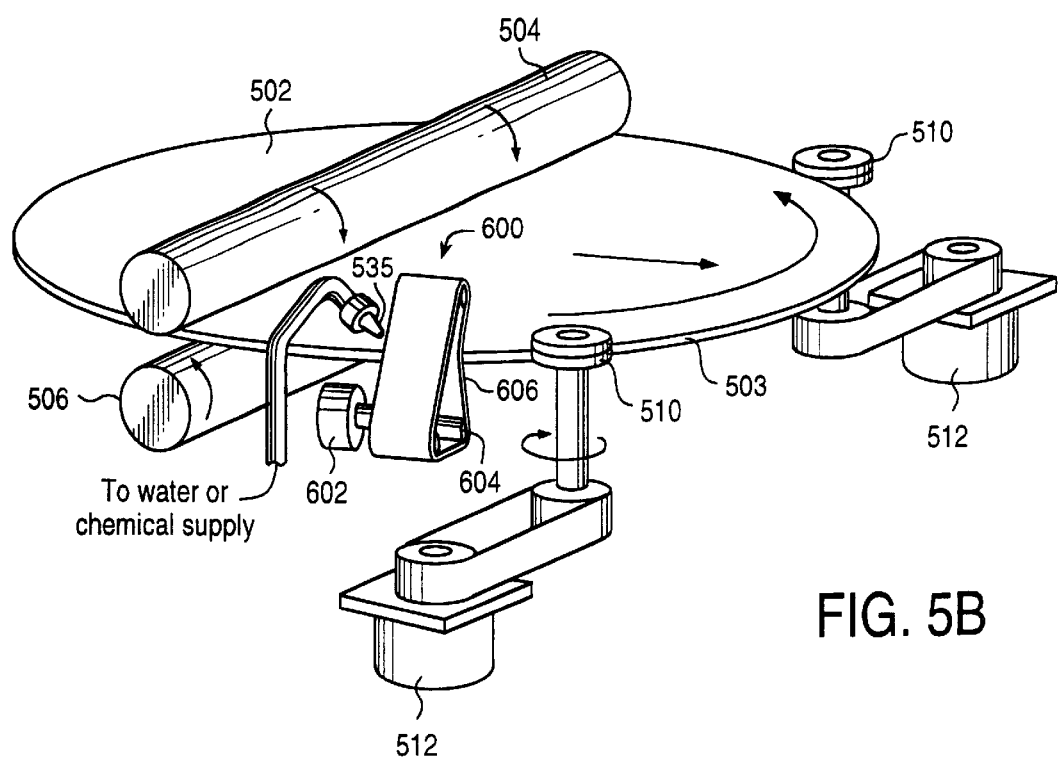
FIG. 5B illustrates a perspective view of the double-sided scrubber of FIG. 5A having a jet spray nozzle for delivering a cleaning fluid to the surface of the wafer.

To further facilitate particle removal, a water jet 535 may be used to propel water into or near the point of contact between rotating belt 606 and wafer edge 503, as shown in FIG. 5B. The water jet may be positioned such that the direction of water flows from a plane aligned with the rotational axis of the wafer and contact points between the wafer and the edge cleaning apparatus. In such a case, the water may simply carry the particles away that are removed from the wafer by the edge cleaning apparatus or may, if at sufficient pressure, cause removal of particles by itself. Note that the water jet is held in place by a support structure which is well-known in the art. In one embodiment, the water jet is held in place above the wafer. Such a jet may be as simple as a barbed coupling with reducing barb to increase the velocity of the created stream. In one embodiment, the barbed coupling is 1/8" to 1/16" in diameter. In another embodiment, the jet may include a nozzle that produces a fanned, knife edge pattern. Water jets are well-known in the art. Note also that jets that spray other chemicals may be used, instead of water, to facilitate particle removal.

Rotating belt 606 may be cleaned occasionally to remove build-up of particles. In one embodiment, the scrubber may flow DI water or a combination of DI water and a chemical such as $NH_4OH$ or $NH_4OH/H_2O_2$ mixture through itself. In an alternate embodiment, the edge cleaning apparatus may be cleaned by spraying DI or a combination of DI and a chemical such as $NH_4OH$ or $NH_4OH/H_2O_2$ onto belt 606 during wafer cleaning to reduce particle build-up.

In one embodiment, a splash shield (not shown) may be provided around the rotating belt edge cleaning apparatus 600 to minimize the dispersion of water, chemicals and contaminates from the surface of belt 606 to other areas of the scrubber system.

Figure 6:
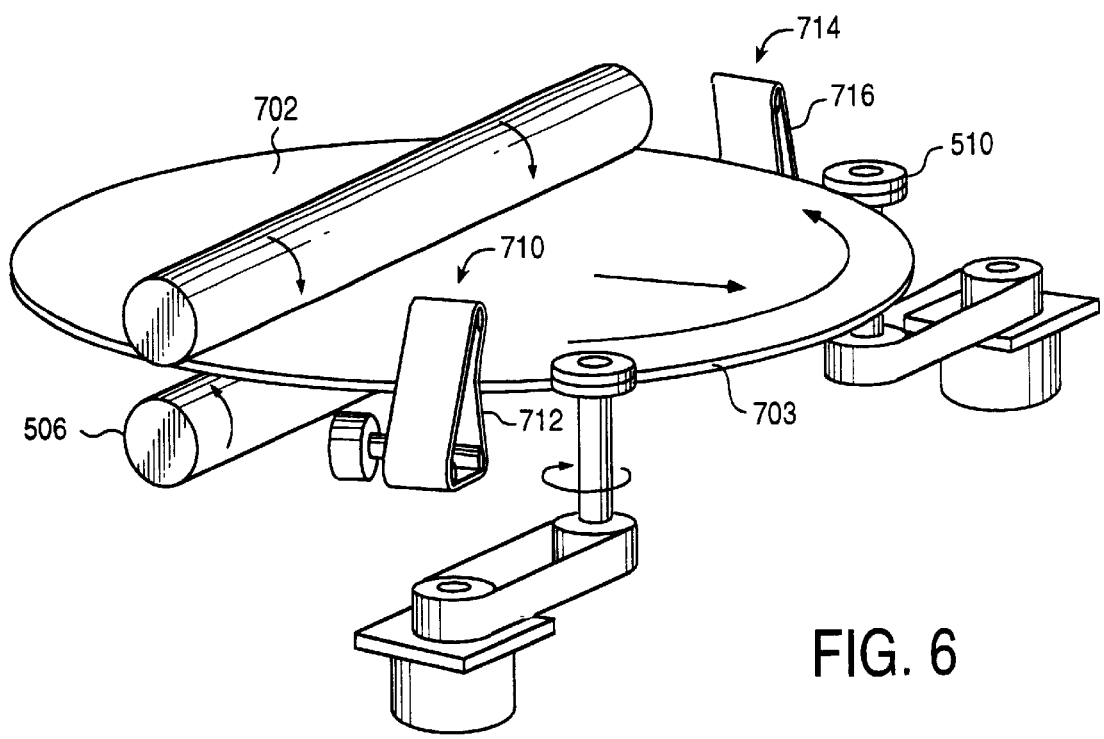
FIG. 6 illustrates a perspective view of a double-sided edge scrubber system having a plurality of rotating belt edge cleaning apparatus.

Another benefit of the present invention lies in the ability to use different types of materials to facilitate the cleaning of a variety of contaminates from the edge or bevel area of a wafer. Materials of different textures may be used within a single belt, or may be incorporated into a plurality of rotating belt edge cleaning devices. In this manner, one material may be used for removing one type of contaminate while another material may be used to remove another type of contaminate. FIG. 6 illustrates an embodiment of the present invention wherein a plurality of rotating belt edge cleaning apparatus are used to sequentially clean the an edge 703 of wafer 702. As wafer 702 rotates, a first rotating belt edge cleaning apparatus 710 containing a first belt 712 of a given texture that cleans particles from edge. The edge of the wafer is then rotated toward a second rotating belt edge cleaning apparatus 714. Edge cleaning apparatus 714 includes a second belt 716 that contains an outer surface having a different texture or abrasiveness than the first belt 712.

Another important feature of the present invention lies in the ability to readily interchange belts of varying types into the edge cleaning apparatus. As a result, a standard rotating edge cleaning design may be used when cleaning any of a variety of contaminates from the edge or bevel area of a wafer. Moreover, it is important to note that materials of different textures may be attached to the outer surface of the edge cleaning belt to enhance the belt's particle removal capability.

Thus, a method and apparatus for cleaning edges of substrates, such as wafers, is disclosed.

We claim:

1. An apparatus for cleaning an edge of a wafer comprising:
   a belt having an inner surface and an outer surface;
   a first roller having an outer surface and a first axis of rotation, said outer surface of said first roller engaging said inner surface of said belt;
   a second roller having an outer surface and a second axis of rotation, said outer surface of said second roller engaging said inner surface of said belt, said second axis of rotation being fixed in relationship to said first axis of rotation;
   a rotation mechanism to rotate said wafer about a third axis of rotation, said third axis of rotation being not parallel to either of said first or said second axes of rotation;
   a motor coupled to said second roller for rotating said belt about said first and second rollers; and
   a positioning mechanism to position said belt against said edge, wherein said first and second axes of rotation are oblique to said third axis of rotation.

2. The apparatus of claim 1 wherein said positioning mechanism comprises a pivoting mechanism to pivot said first roller about a pivot point located at said second axis to position said belt against said edge.

3. The apparatus of claim 1 wherein said positioning mechanism comprises a movable carrier, said first and second rollers being attached to said carrier.

4. The apparatus of claim 1 wherein said first and second axes of rotation are perpendicular to said third axis of rotation.

5. The apparatus of claim 1 wherein said motor comprises a variable speed motor.

6. The apparatus of claim 1 wherein said belt comprises poly vinyl alcohol.

7. The apparatus of claim 1 wherein said belt comprises nylon.

8. The apparatus of claim 1 wherein said belt comprises a combination of abrasive materials.

9. The apparatus of claim 1 further comprising a water jet propelling water at a contact area between said belt and said wafer edge.

10. The apparatus of claim 1 further comprising a jet propelling at least one chemical at a contact area between said belt and said wafer edge.

11. An apparatus for cleaning an edge of a wafer comprising:
    a belt having an inner surface and an outer surface;
    a carrier;
    a first roller having an outer surface and a first axis of rotation, said outer surface of said first roller engaging said inner surface of said belt, said first roller being attached to said carrier at a first point;
    a second roller having an outer surface and a second axis of rotation, said outer surface of said second roller engaging said inner surface of said belt, said second roller being attached to said carrier at a second point;
    a rotation mechanism to rotate said wafer about a third axis of rotation, said third axis of rotation being not parallel to either of said first or said second axes of rotation;
    said carrier being movable to engage and disengage said belt with said edge; and
    a motor coupled to said first roller for rotating said belt about said first and second rollers, wherein said first and second axes of rotation are oblique to said third axis of rotation.

12. The apparatus of claim 11 wherein said belt comprises a combination of abrasive materials.

13. The apparatus of claim 11 further comprising a water jet propelling water at a contact area between said belt and said wafer edge.

14. The apparatus of claim 11 further comprising a jet propelling at least one chemical at a contact area between said belt and said wafer edge.

15. The apparatus of claim 11 wherein said motor comprises a variable speed motor.

16. An apparatus for cleaning an edge of a wafer comprising:
   a belt having an inner surface and an outer surface;
   a first roller having an outer surface and a first axis of rotation, said outer surface of said first roller engaging said inner surface of said belt;
   a second roller having an outer surface and a second axis of rotation, said outer surface of said second roller engaging said inner surface of said belt, said second axis of rotation being fixed in relationship to said first axis of rotation;
   a rotation mechanism to rotate said wafer about a third axis of rotation, said third axis of rotation being not parallel to either of said first or said second axes of rotation;
   a motor coupled to said second roller for rotating said belt about said first and second rollers; and
   a positioning mechanism to position said belt against said edge, wherein said belt is unsupported at a point of contact with said edge, and said positioning mechanism comprises a pivoting mechanism to pivot said first roller about a pivot point located at said second axis to position said belt against said edge.

17. The apparatus of claim 16 wherein said positioning mechanism comprises a movable carrier, said first and second rollers being attached to said carrier.

18. The apparatus of claim 16 wherein said first and second axes of rotation are perpendicular to said third axis of rotation.

19. The apparatus of claim 16 wherein said first and second axes of rotation are oblique to said third axis of rotation.

20. An apparatus for cleaning an edge of a wafer comprising:
   a belt having an inner surface and an outer surface;
   a carrier;
   a first roller having an outer surface and a first axis of rotation, said outer surface of said first roller engaging said inner surface of said belt, said first roller being attached to said carrier at a first point;
   a second roller having an outer surface and a second axis of rotation, said outer surface of said second roller engaging said inner surface of said belt, said second roller being attached to said carrier at a second point;
   a rotation mechanism to rotate said wafer about a third axis of rotation, said third axis of rotation being not parallel to either of said first or said second axes of rotation;
   said carrier being movable to engage and disengage said belt with said edge, wherein said belt is unsupported at a point of contact with said edge; and
   a motor coupled to said first roller for rotating said belt about said first and second rollers, wherein said first and second axes of rotation are oblique to said third axis of rotation.

21. The apparatus of claim 20 wherein said belt comprises a combination of abrasive materials.

* * * * *

UNITED STATES PATENT AND TRADEMARK OFFICE
CERTIFICATE OF CORRECTION

PATENT NO.   : 6,357,071 B2
DATED        : March 19, 2002
INVENTOR(S)  : Moinpour et al.

It is certified that error appears in the above-identified patent and that said Letters Patent is hereby corrected as shown below:

<u>Title page,</u>
Item [75], delete "Monsour", insert -- Mansour --.

Signed and Sealed this

First Day of October, 2002

Attest:

Attesting Officer

JAMES E. ROGAN
*Director of the United States Patent and Trademark Office*